428-404
1/6/87 OR H 000,200

United States Statutory Invention Registration [19]

[11] Reg. Number: H200
[43] Published: Jan. 6, 1987

Chen

[54] HIGH TEMPERATURE STRUCTURAL INSULATING MATERIAL

[75] Inventor: Wayne Y. Chen, Munster, Ind.

[73] Assignee: The United States of America as represented by the United States Department of Energy, Washington, D.C.

[21] Appl. No.: 625,324

[22] Filed: Jun. 27, 1984

[51] Int. Cl.[4] ..... C30B 29/16; B29C 71/02
[52] U.S. Cl. ..... 428/404; 428/407; 264/43; 501/86
[58] Field of Search ..... 264/43, DIG. 6

[56] References Cited

U.S. PATENT DOCUMENTS

| | | | |
|---|---|---|---|
| 2,634,563 | 1/1972 | Asbury | 264/44 |
| 2,691,598 | 10/1954 | Meurice et al. . | |
| 2,806,509 | 9/1957 | Bozzacco et al. . | |
| 2,811,457 | 10/1957 | Speil et al. . | |
| 3,298,842 | 1/1967 | Seufert | 264/43 |
| 3,632,385 | 1/1972 | Schmidt | 264/29 |
| 3,888,691 | 6/1975 | Villani | 264/43 |
| 3,974,315 | 8/1976 | Murata | 428/212 |
| 4,078,028 | 3/1978 | Kishi | 264/43 |

OTHER PUBLICATIONS

Chen, Wayne Y. C., High Temperature Structural Insulating Material with Closed Cell Structure, Particulate Science and Technology, 1983, pp. 335–356.
"Proc. of the First Conf. on Advanced Materials for Alternative Fuel Capable Directly Fired Heat Engines" edited by John W. Fairbanks and John Stringer, Jul. 31–Aug. 3, 1979, pp. 527–541, pp. 582–605.
"A Closed Cell Structural Material Having High Temperature Thermal Insulating Properties" by W. Y. C. Chen and J. G. Daley, Argonne National Laboratory Report, ANL-82-54, 1982.
Large Cost Reduction and Efficiency Enhancement of Stirling Engines by Deployment of Porous Ceramic Insulation" (Feasibility Study), Stirling Technology, Inc., 1980.

*Primary Examiner*—Herbert B. Guynn
*Assistant Examiner*—Eric Jorgensen
*Attorney, Agent, or Firm*—James W. Weinberger; Arthur A. Churm; Judson R. Hightower

[57] ABSTRACT

A high temperature structural insulating material useful as a liner for cylinders of high temperature engines through the favorable combination of high service temperature (above about 800° C.), low thermal conductivity (below about 0.2 W/m° C.), and high compressive strength (above about 250 psi). The insulating material is produced by selecting hollow ceramic beads with a softening temperature above about 800° C., a diameter within the range of 20–200 μm, and a wall thickness in the range of about 2–4 μm; compacting the beads and a compatible silicate binder composition under pressure and sintering conditions to provide the desired structural form with the structure having a closed-cell, compact array of bonded beads.

6 Claims, No Drawings

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

HIGH TEMPERATURE STRUCTURAL INSULATING MATERIAL

CONTRACTUAL ORIGIN OF THE INVENTION

The United States Government has rights in this invention pursuant to Contract No. W-31-109-ENG-38 between the U.S. Department of Energy and The University of Chicago representing Argonne National Laboratory.

BACKGROUND OF THE INVENTION

This invention relates to a high-temperature, low-density structural insulating composite having a favorable combination of low thermal conductivity, high compressive strength and elevated service temperature. Composites of the invention have properties useful as insulating structures at high temperatures and particularly as liners within cylinders of high temperature engines.

In the development of high temperature liners, available materials have in general not exhibited the desired combination of thermal conductivity and compressive strengths at operating temperatures of 800° C. and above. The thermal conductivity of amorphous glass is in the order of 1.2 Watts/meter/°C.(W/m°C.). A commercial glass ceramic with voids has a thermal conductivity in the order of 0.6 W/m°C. At this value (0.6 W/m°C.) of conductivity, calculations indicate that the radial heat conduction through the ceramic is roughly equal to the axial heat conduction through the metal wall which the ceramic is intended to replace for thermal purposes. Calculations further indicate that efficiency of a heat engine and particularly a Stirling engine would be improved if the thermal conductivity of the insulation could be lowered to about 0.2 W/m°C.

While some materials have the lower thermal conductivity, they usually have a useful service temperature below 800° C. and/or insufficient compressive strength. In many instances, low thermal conductivity is combined with low strength or high thermal conductivity is combined with high strength. A material having a combination of a thermal conductivity below about 0.20 W/m°C. and a strength above about 250 psi and particularly above about 400 psi would be desirable.

Accordingly, one object of the invention is a high temperature insulating material. Another object is a high temperature insulating material capable of being formed into a structural member. An additional object is a high temperature insulating material having a thermal conductivity below about 0.2 W/m°C., a compressive strength above about 250 psi and a useful service temperature of above about 800° C. These and other objects will become apparent from the following description.

SUMMARY OF THE INVENTION

Briefly, the invention is directed to a high temperature structural insulating material characterized by a closed-cell, compact array of hollow ceramic beads bonded together under pressure and sintering conditions, and to a method of producing the structural materials. For purposes of this invention, "ceramic" refers to a material having crystalline properties. The material or composite is produced by forming a mixture of hollow ceramic beads and a binder composition wherein the beads and binder composition (coating the beads) are compacted under sintering conditions (below the softening temperature of the ceramic beads) and under pressure to provide a compact, tightly packed array of the beads with closed cells with the adjacent surface areas of the beads being bonded together by the binder. The ceramic beads preferably have a softening temperature above about 800° C., a size within the range of 20–200 μm diameter and a wall thickness in the range of about 2–4 μm. The binder composition preferably includes a wetting agent and is used in an amount sufficient to coat the external surface areas of the beads.

DETAILED DESCRIPTION OF THE PREFERRED EMBODIMENT

In the method for producing the inventive composite, hollow ceramic beads are selected which are small in size, typically 20–200 microns in diameter with wall thicknesses above about 2.0 microns. They are further characterized by a bulk density in the order of about 0.3–0.5 gm/cc. They also are of closed cell, have low thermal conductivity and have a fine finish and low friction.

A mixture is formed of the beads and a compatible binder composition. Preferably, the binder composition includes a wetting agent such as an alcohol ethoxylate to improve compatibility. Mixing is carried out by a stirrer controlled by a low speed motor to remove air. Suitable weight ratios of beads:binder composition are in the order of 1:1–2 and preferably about 1:1.2–1.6. With the wetting agent, the ratios of beads: wetting agent:binder are in the order of 1:0.01–0.02:1–2 and preferably 1:0.012–0.016:1.2–1.6.

The binder is selected to form a strong adhesive bond between adjacent surface areas of the beads. With colloidial silica gel binder, a wetting agent is preferably used to increase contact between the beads and binder. Preferably, the binder is a commercial colloidal silica solution marketed by DuPont Corporation as Ludox HS30.

The combination of beads, wetting agent and binder after mixing are inserted into a suitably shaped form and compacted under sintering conditions and pressure to provide a compact, tightly packed composite. The sintering conditions include a temperature of above about 700° C. and preferably above about 800° C. With ceramics having a softening temperature above about 1200° C., the sintering temperature preferably is above about 900° C. Preferably, the pressure is applied incremently to reduce the initial volume by 10–20% and provide some slight physical distortion of the beads to increase the adjacent surface areas of the beads and provide a compact composite.

The following examples are provided for illustrative purposes and are not intended to be restrictive as to the scope of the invention:

EXAMPLES I-IV

In tests to produce an insulating composite, two different beads were selected having useful temperatures above about 800° C. and other properties as set forth in Table I. Both were obtained from Emerson Cummins Company of Canton, Massachusetts and are identified as "SI" (a borosilicate glass) and "FA-A" (a ceramic) being crystalline and reportedly having a metal content predominantly of Si and Al with Fe, Mg, Na, K and Ti being present by weight in the respective amounts of 2%, 1%, 0.5% 0,5% and 1%. Properties of these beads plus a sample of glass beads (D32/4500) from Minnesota Mining and Manufacturing Company are provided in Table I.

TABLE I

Physical Properties of Three Microsphere Brands

| Commercial Designation | SI | FA-A | D32/4500 |
|---|---|---|---|
| Composition | glass | ceramic | glass |
| Bulk Density, | | | |
| lb./cu.ft. | 9.5 | 25.0 | |
| g./cc. | 0.155 | 0.4 | 0.32 |
| True Particle Density | | | |
| lb./cu./ft. | 15.8 | 46.5 | |
| g./cc. | 0.254 | 0.65 | |
| Particle Size Range (by weight) | | | |
| >175μ | 0 | 5 | |
| 149–175μ | 14 | 11 | |
| 125–145μ | 10 | 19 | |
| 100–125μ | 12 | 24 | |
| 62–100μ | 40 | 35 | |
| 44–62μ | 15 | 4 | |
| <44μ | 9 | 2 | |
| Packing Factor | 0.559 | 0.620 | |
| Average Wall Thickness, μm | 1.5 | 3.5 | 0.8–2.2 |
| Softening Temperature | 985 | 1200 | 715 |
| Strength under hydrostatic Pressure [Volume % savings at 1500 psi (100 kg./cm$^2$)] | 55.0 | 83.0 | 10 |
| Thermal Conductivity (W/m °C.) | 0.10 | 0.13 | 0.029–0.12 |

Six samples of the FA-A beads having bulk densities varying between 0.422–0.474 gm/cc were made into composites. Previously, it had been determined that FA-A beads could not be sintered in air at 950° C. without any binder. In the process, the beads of each sample were mixed with a wetting agent (GAF's Antarox BL240) and a binder (DuPont's Ludox HS30) in a ratio of 1:0.015:1.4. The mixing was carried out by stirrer connected to a slow motor. The wetting agent is further identified as an alcohol ethoxylate with the binder being identified as a colloidal silica solution (aluminum modified silicate, pH values 8.6–9.3).

The mixture was then placed in a hollow form to provide a wall-like shape and heated to about 950° C. for sintering for about 8.5 hours. Pressure (estimated to be at least 50–100 psi) on the mixture was applied by a compactor and reduced the volume by about 20%.

As revealed by scanning electron photomicrographs, the beads are retained in compact, tightly packed structures without cracks in adjacent portions of the beads. Most of the beads are bonded to adjacent beads to form structural-strong arrays of bonded beads. The information from enlarged photos further reveals a slight distortion of many beads which increases the surface area of bonding between adjacent beads.

Performance tests were run on the four samples and provided the data in Table II.

TABLE II

| Sample | Bulk Density gm/cc | Compressive Strength psi | Young's Modulus | Thermal Conductivity Strength W/m °C. |
|---|---|---|---|---|
| 330 | 0.446 | 968 | $27.30 \times 10^4$ psi | 0.122 |
| 412 | 0.440 | 1208 | $8.88 \times 10^4$ psi | 0.110 |
| 419 | 0.474 | 627 | $5.89 \times 10^4$ psi | 0.117 |
| 615 | 0.423 | (488–573) | $(7.08–7.48) \times 10^4$ psi | 0.104 |

As indicated above, the thermal conductivity was below about 0.2 W/m°C. with a compressive strength above about 400 psi. These materials also exhibited low thermal stress and low gas permeability.

In contrast, other tests with the "SI" beads were carried out and revealed that collapse of the beads occurred at about one atmosphere pressure and 830° C. Sintering of the beads at 950° C. with sodium silicate solution was unsuccessful as only partial sintering was obtained. Bonding agents were used including Dupont's Ludox HS30 without success. Inspection of the samples revealed that the walls of some beads become broken and the beads tended to soften and deform.

Beads having lower softening temperatures of 700° C. and identified as D32/4500 from Minnesota Mining and Manufacturing Company were made into composites by sintering at about 600° C. without any bonding agent. While they exhibited good properties of thermal conductivity and strength, their low softening temperature would limit their usefulness at temperatures above 800° C.

The foregoing description of embodiments of the invention has been presented for purposes of illustration and description. It is not intended to be exhaustive or to limit the invention to the precise form disclosed, and obviously many modifications and variations are possible in light of the above teaching.

The embodiments of the invention in which an exclusive property or privilege is claimed are defined as follows:

1. A method of producing a structural insulating composite having a useful temperature above about 800° C. a thermal conductivity of below about 0.2 Watts/meter/°C. as measured at temperatures in the range of 25°–200° C. and a compressive strength above about 400 psi, the method comprising the steps of selecting hollow ceramic beads having a metal content predominantly of Si and Al, an outer diameter in the range of about 20–200 microns, a wall thickness of above about 2 microns, a softening temperature above about 800° C., and a bulk density above about 0.3 gm/cc, forming a mixture of the ceramic beads with a compatible binder composition in amounts sufficient to coat the beads and in a beads-to-binder ratio of about 1:1–2 by weight, removing entrained gas bubbles in said mixture, and compacting the mixture under sintering conditions and pressure to provide the structural insulating composition, the sintering conditions including a temperature below the softening temperature but above 700° C., and a sintering time sufficient to produce said composite with said temperature, thermal conductivity and compressive strength, the pressure being applied to increase the surface area of contact between the bead surface areas being joined by the binder composition.

2. The method of claim 1 wherein the selection of ceramic beads results in said beads having a thickness of about 2–4 μm.

3. The method of claim 2 wherein the binder composition includes a wetting agent in a ratio of beads:wetting agent:binder of about 1:0.012–0.016:1.2–1.6.

4. The method of claim 3 wherein the binder composition includes colloidal silica suspension having ceramic bonding properties as a binder and the ratio is about 1:1.4, and said beads have a minor content of Fe, Mg, Na, K and Ti.

5. A shaped, structural insulating composite being the product of the method of claim 1 and characterized by a closely packed, bonded array of said beads with closed cells.

6. The shaped, structural insulating composite of claim 5 wherein the weight ratio of beads to binder composition is about 1:1.4.

* * * * *